United States Patent

Funahashi et al.

(10) Patent No.: US 9,654,065 B2
(45) Date of Patent: May 16, 2017

(54) DIGITAL AMPLITUDE MODULATION DEVICE AND DIGITAL AMPLITUDE MODULATION METHOD

(71) Applicant: Kabushiki Kaisha Toshiba, Minato-ku, Tokyo (JP)

(72) Inventors: Yuuki Funahashi, Fuchu Tokyo (JP); Seiki Katayama, Inagi Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/653,757

(22) PCT Filed: Aug. 2, 2013

(86) PCT No.: PCT/JP2013/071043
§ 371 (c)(1),
(2) Date: Jun. 18, 2015

(87) PCT Pub. No.: WO2014/103420
PCT Pub. Date: Jul. 3, 2014

(65) Prior Publication Data
US 2015/0326191 A1 Nov. 12, 2015

(30) Foreign Application Priority Data

Dec. 27, 2012 (JP) ................................ 2012-285122

(51) Int. Cl.
*H03C 1/52* (2006.01)
*H03F 3/21* (2006.01)
(Continued)

(52) U.S. Cl.
CPC .............. *H03F 3/211* (2013.01); *H03F 1/52* (2013.01); *H03F 3/19* (2013.01); *H03F 3/24* (2013.01);
(Continued)

(58) Field of Classification Search
CPC ... H03F 1/52; H03F 3/24; H03F 3/211; H03F 3/19; H03F 2203/21157; H03F 2200/451; H03F 2200/426
(Continued)

(56) References Cited

U.S. PATENT DOCUMENTS

| | | | | |
|---|---|---|---|---|
| 5,886,573 A | * | 3/1999 | Kolanek | H03F 1/0277 330/10 |
| 6,124,758 A | * | 9/2000 | Korte | H03G 3/3042 330/124 R |
| 2015/0326191 A1 | * | 11/2015 | Funahashi | H03F 1/52 330/2 |

FOREIGN PATENT DOCUMENTS

| | | |
|---|---|---|
| JP | S57-174910 A | 10/1982 |
| JP | S62-008737 U | 1/1987 |

(Continued)

OTHER PUBLICATIONS

First Office Action mailed by Japan Patent Office on Feb. 25, 2014 in the corresponding Japanese patent application No. 2012-285122—7 pages.
(Continued)

*Primary Examiner* — Nay A Maung
*Assistant Examiner* — Angelica M Perez
(74) *Attorney, Agent, or Firm* — Knobbe, Martens, Olson & Bear LLP

(57) ABSTRACT

A digital amplitude modulation device includes power amplifiers, a compositor, a filter, a measurement unit, a protection unit, and a controller. The power amplifiers are arranged in parallel and amplify an input signal in accordance with ON control and stop output in accordance with OFF control. The filter suppresses an unnecessary component to generate an AM signal. The measurement unit measures a measurement value between the filter and a signal output terminal and output the AM signal generated (Continued)

by the filter. The protection unit includes a calculator and a first processing unit. The calculator is formed from an analog circuit and calculates an evaluation value based on the measurement value. The first processing unit is formed from an analog circuit and generates a first control signal by referring to the evaluation value. Upon receiving the first control signal, the controller OFF-controls the power amplifiers.

10 Claims, 10 Drawing Sheets

(51) Int. Cl.
*H03F 3/19* (2006.01)
*H03F 1/52* (2006.01)
*H03F 3/24* (2006.01)

(52) U.S. Cl.
CPC .. *H03F 2200/426* (2013.01); *H03F 2200/451* (2013.01); *H03F 2203/21157* (2013.01)

(58) Field of Classification Search
USPC .......................... 455/108; 375/295, 297, 300
See application file for complete search history.

(56) References Cited

FOREIGN PATENT DOCUMENTS

| | | | |
|---|---|---|---|
| JP | H03-272208 | A | 12/1991 |
| JP | H04-056522 | A | 2/1992 |
| JP | H07-015253 | A | 1/1995 |
| JP | H10-336059 | A | 12/1998 |
| JP | H11-330990 | A | 11/1999 |
| JP | 2000-092412 | A | 3/2000 |
| JP | 2004-320329 | A | 11/2004 |
| JP | 2011-171967 | * | 9/2011 |
| JP | 2011-171967 | A | 9/2011 |

OTHER PUBLICATIONS

International Search Report mailed by Japan Patent Office on Nov. 5, 2013 in the corresponding PCT Application No. PCT/JP2013/071043—10 pages.
An English translation of International Preliminary Report on Patentability issued by the International Bureau of WIPO on Jun. 30, 2015 in the corresponding PCT Application No. PCT/JP2013/071043—6 pages.

* cited by examiner

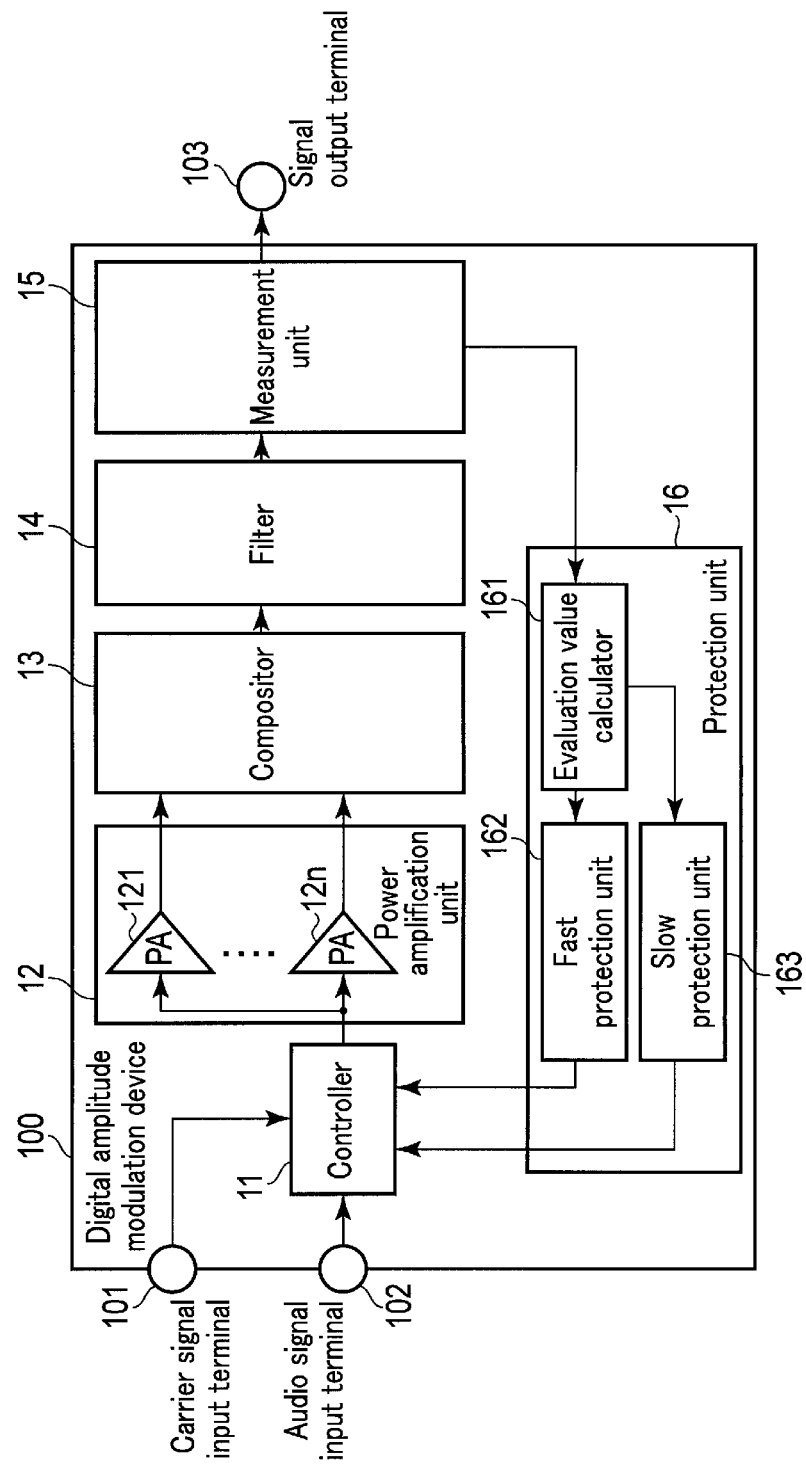
F I G. 1

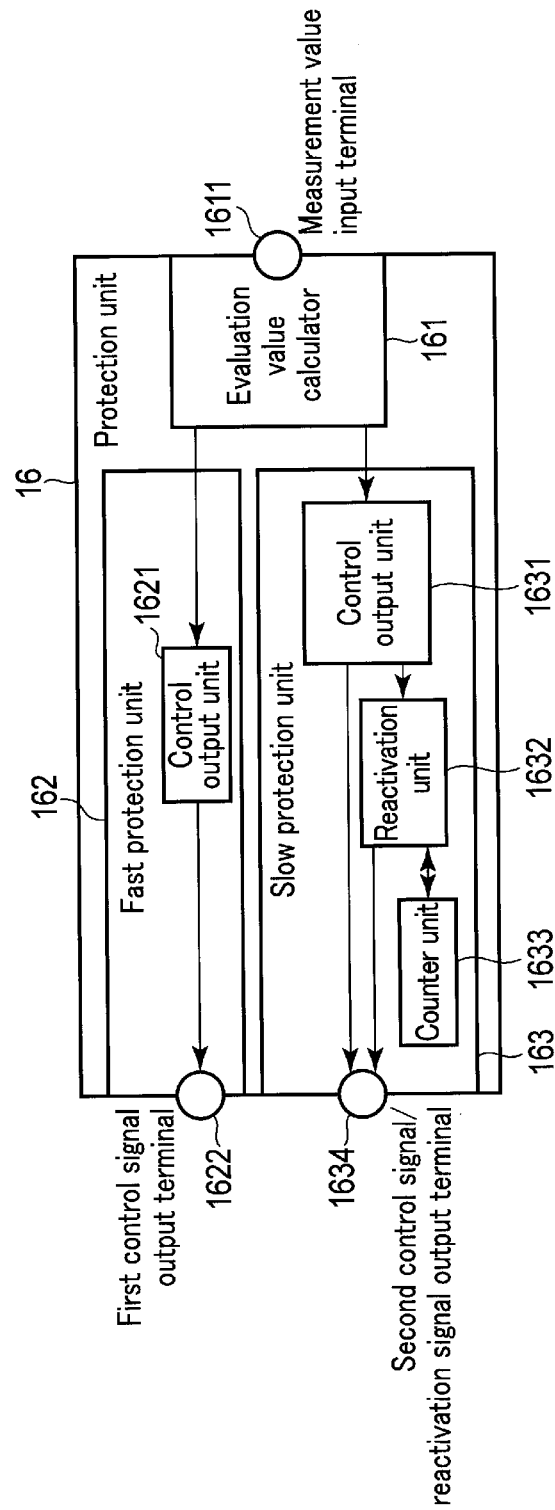
F I G. 2

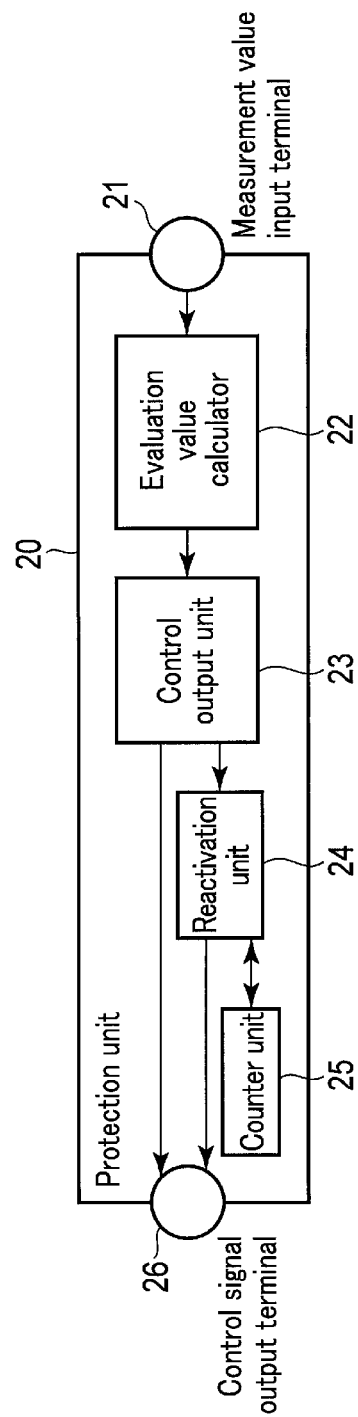
F I G. 7

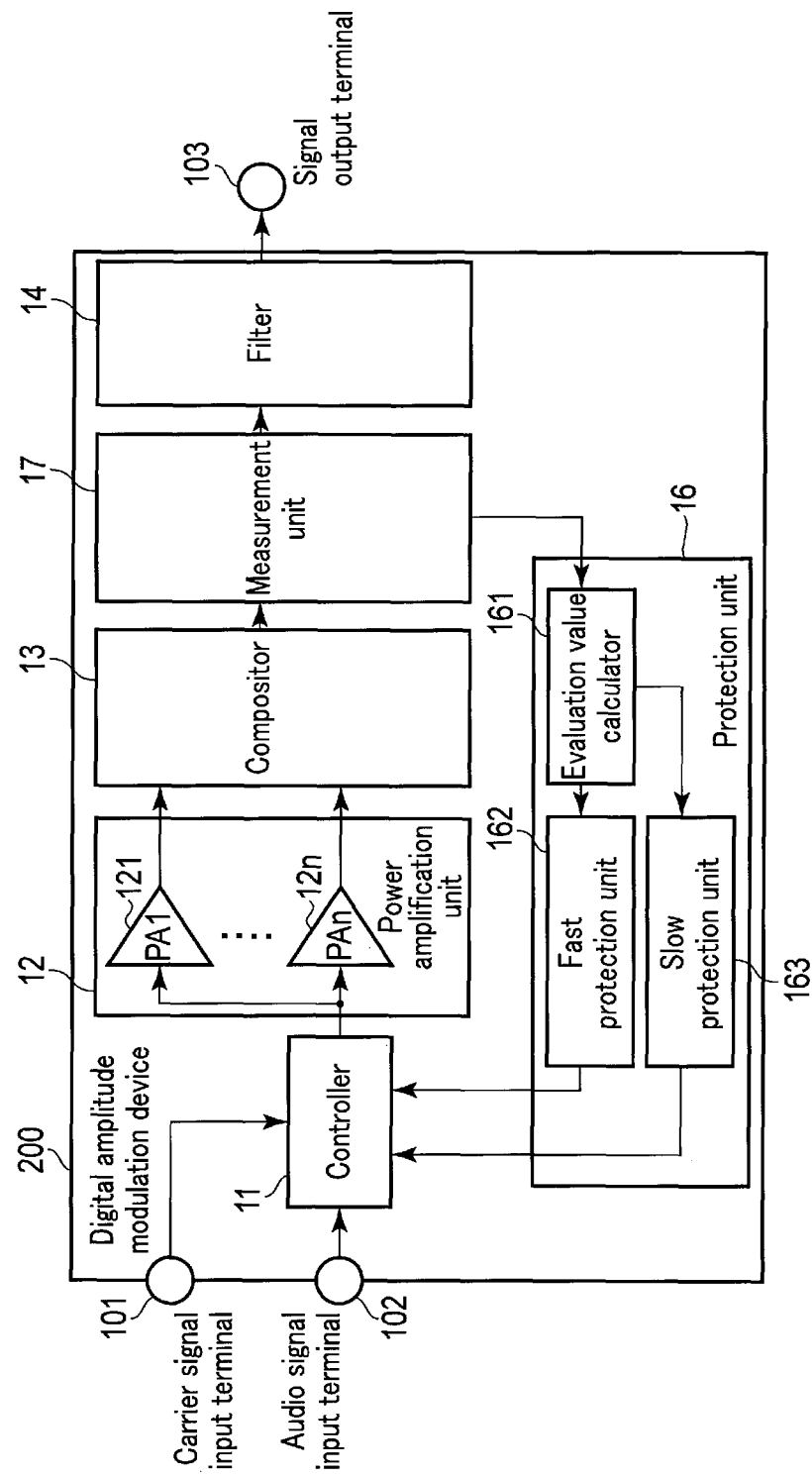
F I G. 10

DIGITAL AMPLITUDE MODULATION DEVICE AND DIGITAL AMPLITUDE MODULATION METHOD

CROSS-REFERENCE TO RELATED APPLICATIONS

This is a U.S. national phase application, under 35 U.S.C. §371, of International Application PCT/JP2013/071043, filed Aug. 2, 2013, which claims priority to Japanese Patent Application No. 2012-285122, filed Dec. 27, 2012. The foregoing applications are incorporated by reference herein in their entirety.

FIELD

Embodiments described herein relate generally to a digital amplitude modulation device used in, for example, an MF broadcasting transmitter and a digital amplitude modulation method used by the digital amplitude modulation device.

BACKGROUND

In, for example, MF broadcasting, a transmitter uses a digital amplitude modulation device. The digital amplitude modulation device includes a plurality of power amplifiers arranged in parallel. The digital amplitude modulation device ON/OFF-controls the plurality of power amplifiers based on the voltage amplitude level of a modulated signal such as an audio signal supplied from the outside, thereby amplifying a carrier signal while changing the number of power amplifiers to be driven. The digital amplitude modulation device composites the output signals of the power amplifiers in the ON state to generate an AM wave (Amplitude Modulation Wave), and sends out the generated AM wave to a predetermined broadcasting service area.

In a digital amplitude modulation device of this type, if some kind of fault such as breakage of a power amplifier or short-circuit/open-circuit of the compositor occurs, the signal quality of the AM wave may degrade. It is therefore necessary to prevent the power amplifiers from breaking at the time of, for example, a lightning strike, load system abnormalities such as disconnection, malfunction, and surging, and degradation in SWR (Standing Wave Ratio) caused by the load characteristic of an antenna.

To prevent breakage of power amplifiers, the digital amplitude modulation device measures the voltage and the current in the process of transmitting the AM wave and controls units in the devices based on the measurement result. For example, a method of reducing output power to 0 by turning off the switch of the transmission circuit and a method of reducing transmission power to the power amplifiers when an SWR value calculated based on the measured voltage and current exceeds a warning value limit at which the power amplifiers may break are known.

To calculate the SWR value, a CPU (Central Processing Unit) is used in general. Because of a large calculation delay amount, the CPU cannot follow an abrupt change in the SWR value in real time upon a lightning strike or the like. Hence, it is difficult for the digital amplitude modulation device to prevent breakage of the power amplifiers. The problem of calculation delay amount also arises even when a digital circuit formed from a CPLD (Complex Programmable Logic Device) or FPGA (Field Programmable Gate Array) is used for control to prevent breakage of the power amplifiers.

CITATION LIST

Patent Literatures

Patent Literature 1: Jpn. UM Appln. KOKAI Publication No. 62-8737

Patent Literature 2: Jpn. Pat. Appln. KOKAI Publication No. 11-330990

SUMMARY OF THE INVENTION

Technical Problem

As described above, to prevent breakage of the power amplifiers, the conventional digital amplitude modulation device measures the voltage and the current in the process of transmitting the AM wave and controls the units in the devices based on the measurement result. However, if occurrence of an abnormality causes an abrupt change, the digital circuit cannot cope with the abrupt change because of a calculation delay.

It is an object to provide a digital amplitude modulation device capable of following, in real time, even an abrupt change caused by occurrence of an abnormality and a digital amplitude modulation method used by the digital amplitude modulation device.

Solution to Problem

According to an embodiment, a digital amplitude modulation device comprises a plurality of power amplifiers, a compositor, a filter, a measurement unit, a protection unit, and a controller. The plurality of power amplifiers are arranged in parallel and configured to amplify an input signal in accordance with ON control and stop output in accordance with OFF control. The compositor composites signals output from the power amplifiers to generate a composite signal. The filter suppresses an unnecessary component of the composite signal generated by the compositor to generate an AM (Amplitude Modulation) signal in an RF (Radio Frequency) band. The measurement unit measures a measurement value between the filter and a signal output terminal configured to output the AM signal in the RF band generated by the filter. The protection unit includes a calculation unit formed from an analog circuit and configured to calculate an evaluation value based on the measurement value measured by the measurement unit, and a first processing unit formed from an analog circuit and configured to generate a first control signal for OFF-controlling the plurality of power amplifiers based on the calculated evaluation value. The controller ON-controls and/or OFF-controls the plurality of power amplifiers by referring to an amplitude level of a modulated signal, and upon receiving the first control signal, OFF-controls the plurality of power amplifiers.

BRIEF DESCRIPTION OF THE DRAWINGS

FIG. 1 is a block diagram showing the functional arrangement of a digital amplitude modulation device according to the first embodiment.

FIG. 2 is a block diagram showing the functional arrangement of a protection unit shown in FIG. 1.

FIG. 7 is a block diagram showing the functional arrangement of the protection unit of the conventional digital amplitude modulation device.

FIG. 10 is a block diagram showing the functional arrangement of a digital amplitude modulation device according to the second embodiment.

DETAILED DESCRIPTION

Figure 3:
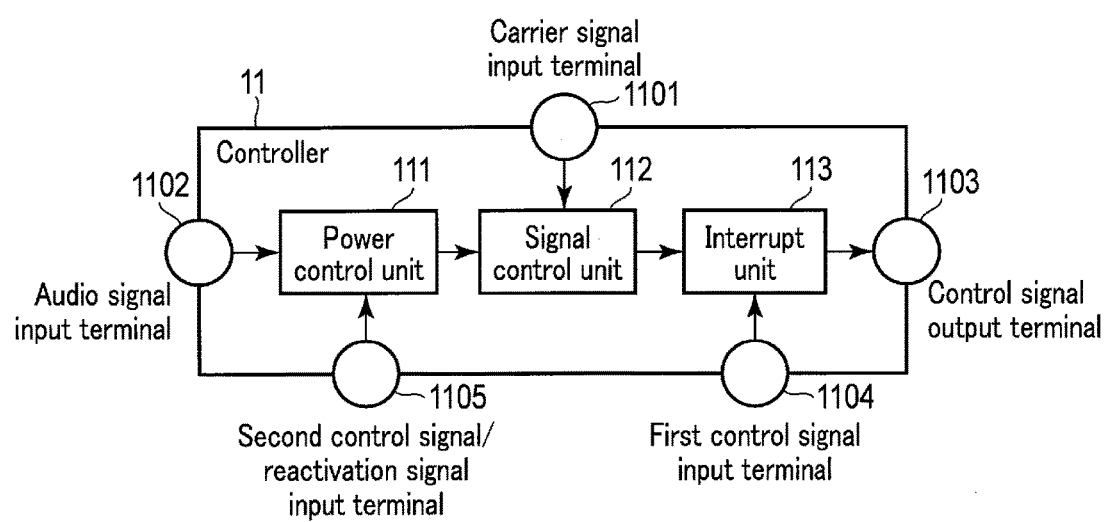
FIG. 3 is a block diagram showing the functional arrangement of a controller shown in FIG. 1.

Embodiments will now be described with reference to the accompanying drawings.

First Embodiment

FIG. 1 is a block diagram showing the functional arrangement of a digital amplitude modulation device 100 according to the first embodiment. The digital amplitude modulation device 100 shown in FIG. 1 includes a controller 11, a power amplification unit 12, a compositor 13, a filter 14, a measurement unit 15, a protection unit 16, a carrier signal input terminal 101, and an audio signal input terminal 102. A carrier signal that is a transmission signal is input to the carrier signal input terminal 101. An audio signal that is a modulated signal is input to the audio signal input terminal 102.

The power amplification unit 12 includes n power amplifiers (PA) 121 to 12n. The carrier signal input to the carrier signal input terminal 101 is distributed to the power amplifiers 121 to 12n via the controller 11. The power amplifiers 121 to 12n receive the distributed carrier signals. The power amplifiers 121 to 12n are ON-controlled by the controller 11 to a driven state and amplify the received carrier signals to a preset level. The power amplifiers 121 to 12n are also OFF-controlled by the controller 11 to a stop state to stop output.

The compositor 13 composites the carrier signals amplified by the power amplifiers 121 to 12n.

The filter 14 filters the composite signal composited by the compositor 13, thereby suppressing unnecessary components included in the composite signal. The filter 14 outputs the composite signal after the filtering from a signal output terminal 103 via the measurement unit 15 as an amplitude-modulated broadcast wave (amplitude modulation wave) in the RF band. A transmission antenna (not shown) is connected to the output side of the signal output terminal 103. In general, a matching circuit, a filter, a rejecter, a trap circuit, and the like are inserted between the signal output terminal 103 and the transmission antenna.

The measurement unit 15 measures the voltage value and the current value of the broadcast wave supplied from the filter 14 and/or the voltage value and the current value of a signal supplied from the signal output terminal 103. The measurement unit 15 outputs the measured voltage value and current value to the protection unit 16. Note that the values to be measured are not limited to the voltage value and the current value, and a voltage value v1 and a voltage value v2 whose phase is different from that of the voltage value v1 by π/2 may be combined. That is, the voltage value v1 and the voltage value v2 different from the voltage value v1 by λ/4 are measured, where λ is a wavelength.

FIG. 2 is a block diagram showing the functional arrangement of the protection unit 16 shown in FIG. 1. The protection unit 16 shown in FIG. 2 includes an evaluation value calculator 161, a fast protection unit 162 serving as a first processing unit, and a slow protection unit 163 serving as a second processing unit.

The evaluation value calculator 161 is formed using analog circuits including analog ICs, for example, an operational amplifier and a comparator, and includes a measurement value input terminal 1611. The measurement value measured by the measurement unit 15 is input to the measurement value input terminal 1611. The evaluation value calculator 161 calculates an evaluation value that is one of an SWR (Standing Wave Ratio), reflection coefficient, and reflection power based on the measurement value input from the measurement value input terminal 1611. The evaluation value calculator 161 outputs the calculated evaluation value to the fast protection unit 162 and the slow protection unit 163.

The fast protection unit 162 is formed using analog circuits including analog ICs, for example, an operational amplifier and a comparator, and includes a control output unit 1621 and a first control signal output terminal 1622. If the evaluation value calculated by the evaluation value calculator 161 is equal to or larger than a first reference value that is a preset threshold, the control output unit 1621 generates a first control signal. The first control signal instructs the controller 11 to OFF-control the power amplifiers 121 to 12n. At this time, the status of the first control signal is STOP. The pulse width of the first control signal is assumed to be longer than the calculation delay time in the slow protection unit 163 formed using a digital circuit. The control output unit 1621 outputs the generated first control signal from the first control signal output terminal 1622 to the controller 11.

The slow protection unit 163 is formed using a digital circuit, for example, a CPU, a CPLD, or an FPGA, and includes a control output unit 1631, a reactivation unit 1632, a counter unit 1633, and a second control signal/reactivation signal output terminal 1634. The control output unit 1631 generates a second control signal based on the evaluation value calculated by the evaluation value calculator 161. The second control signal instructs the controller 11 of the upper limit of the number of power amplifiers 121 to 12n to be ON-controlled. At this time, the status of the second control signal is STOP. The control output unit 1631 stores a plurality of second reference values in advance. If the evaluation value that is one of the SWR, reflection coefficient, and reflection power exceeds the second reference value, the control output unit 1631 sets a number according to the second reference value as the upper limit. For example, assume that one of the second reference values is a second reference value A, and another second reference value smaller than the second reference value A is a second reference value B (second reference value A>second reference value B). In this case, if the evaluation value is equal to or larger than the second reference value B (evaluation value≥second reference value B), the upper limit of the number of power amplifiers 121 to 12n to be ON-controlled is set to n/2. If the evaluation value is equal to or larger than the second reference value A (evaluation value≥second reference value A), the upper limit of the number of power amplifiers 121 to 12n to be ON-controlled is set to 0. Note that the reference value and the upper limit are arbitrarily set by the device. The function of calculating the evaluation value from the measurement value measured by the measurement unit 15 may be given to the slow protection unit 163 so as to calculate the evaluation value by the slow protection unit 163. That is, in this configuration, the measurement value measured by the measurement unit 15 is input to the evaluation value calculator 161 and also directly input to the slow protection unit 163. The control output unit 1631 outputs the generated second control signal from the second control signal/reactivation signal output terminal 1634 to the controller 11, and outputs it to the reactivation unit 1632 as well. Note that if a second reference value C that is one of the plurality of second reference values is smaller than the first reference value, and the evaluation value is smaller than the first reference value and equal to or larger than the second reference value C (first reference value>evaluation value≥second reference value C), the protection unit 16 outputs only the second control signal.

Upon receiving the second control signal, the reactivation unit 1632 starts counting the control time. After the power amplifiers are ON/OFF-controlled based on the second control signal, the reactivation unit 1632 outputs a reactivation signal from the second control signal/reactivation signal output terminal 1634 to the controller 11 after the start of counting of the control time and after the elapse of a predetermined time. The reactivation signal has a predetermined pulse width and instructs the controller 11 of the same upper limit as the upper limit set before the evaluation value becomes equal to or larger than the reference value (evaluation value≥reference value). At this time, the status of the second control signal is RUN. The predetermined pulse width is the width of a time shorter than the minimum allowed time (for example, a time until an overcurrent is supplied to the power amplifiers because of the short circuit of the load, and the power amplifiers generate heat to break the power amplification unit) (100 µs) of the power amplifiers 121 to 12n. The elapse of a predetermined time indicates a time in which the reactivation signal appears after the end of the first control signal. The reactivation unit 1632 sets the upper limit of the number of power amplifiers 121 to 12n to be ON-controlled by the reactivation signal after the elapse of the predetermined pulse width to the value set by the second control signal. At this time, the status of the second control signal is STOP. When the reactivation unit 1632 outputs the reactivation signal, the counter unit 1633 increments the count value that counts the reactivation count. If the evaluation value exceeds the second reference value, the reactivation unit 1632 repetitively outputs the reactivation signal at an interval longer than the calculation delay time. The count value is incremented every time the reactivation signal is output. If the state in which the evaluation value is equal to or larger than the second reference value is maintained until the count value reaches a preset count, the reactivation unit 1632 ends output of the reactivation signal. Note that if the abnormal state that makes the evaluation value equal to or larger than the reference value is resolved before output of the reactivation signal, all the control signals are canceled.

FIG. 3 is a block diagram showing the functional arrangement of the controller 11 shown in FIG. 1. The control unit 11 shown in FIG. 3 includes a power control unit 111, a signal control unit 112, an interrupt unit 113, a carrier signal input terminal 1101, an audio signal input terminal 1102, a first control signal input terminal 1104, and a second control signal/reactivation signal input terminal 1105.

The power control unit 111 receives the audio signal that is the modulated signal input to the audio signal input terminal 1102 and the second control signal output from the slow protection unit 163 and input to the second control signal/reactivation signal input terminal 1105. In accordance with the voltage amplitude level of the audio signal, the power control unit 111 calculates which power amplifiers should be ON-controlled out of the power amplifiers 121 to 12n within the upper limit instructed by the second control signal. The power control unit 111 outputs information representing which power amplifiers should be ON/OFF-controlled out of the power amplifiers 121 to 12n to the signal control unit 112.

The power control unit 111 also receives the reactivation signal output from the slow protection unit 163 and input to the second control signal/reactivation signal input terminal 1105. In accordance with the voltage amplitude level of the audio signal, the power control unit 111 calculates which power amplifiers should be ON-controlled out of the power amplifiers 121 to 12n within the upper limit instructed by the input reactivation signal. The power control unit 111 outputs information representing which power amplifiers should be ON/OFF-controlled out of the power amplifiers 121 to 12n to the signal control unit 112.

The signal control unit 112 receives the carrier signal input to the carrier signal input terminal 1101 and information output from the power control unit 111. The signal control unit 112 refers to the received information and, in accordance with the frequency of the carrier signal, outputs an ON control signal to each power amplifier to be ON-controlled and an OFF control signal to each power amplifier to be OFF-controlled. At this time, an ON/OFF control signal that controls a power amplifier by changing the level of the carrier signal or an ON/OFF control signal that controls a power amplifier by changing the phase of the carrier signal is used as the ON/OFF control signal. Which control signal should be employed is arbitrarily set by the device.

The interrupt unit 113 receives the ON/OFF control signal generated by the signal control unit 112. The interrupt unit 113 outputs the received ON/OFF control signal from a control signal output terminal 1103 to the power amplifiers 121 to 12n.

The interrupt unit 113 also receives the ON/OFF control signal generated by the signal control unit 112 and the first control signal output from the fast protection unit 162 and input to the first control signal input terminal 1104. The interrupt unit 113 handles the first control signal with priority over the ON/OFF control signal from the signal control unit 112, and outputs the OFF control signal instructed by the first control signal to the power amplifiers 121 to 12n. Note that if the first control signal is not generated, the interrupt unit 113 outputs the ON/OFF control signal from the signal control unit 112.

Note that the arrangement of the controller is merely an example. For example, the functions of the power control unit, that is, the function of calculating the number of power amplifiers 121 to 12n to be ON-controlled and the function of calculating the information representing which power amplifiers should be ON/OFF-controlled out of the power amplifiers 121 to 12n may separately be arranged.

Figure 4A:
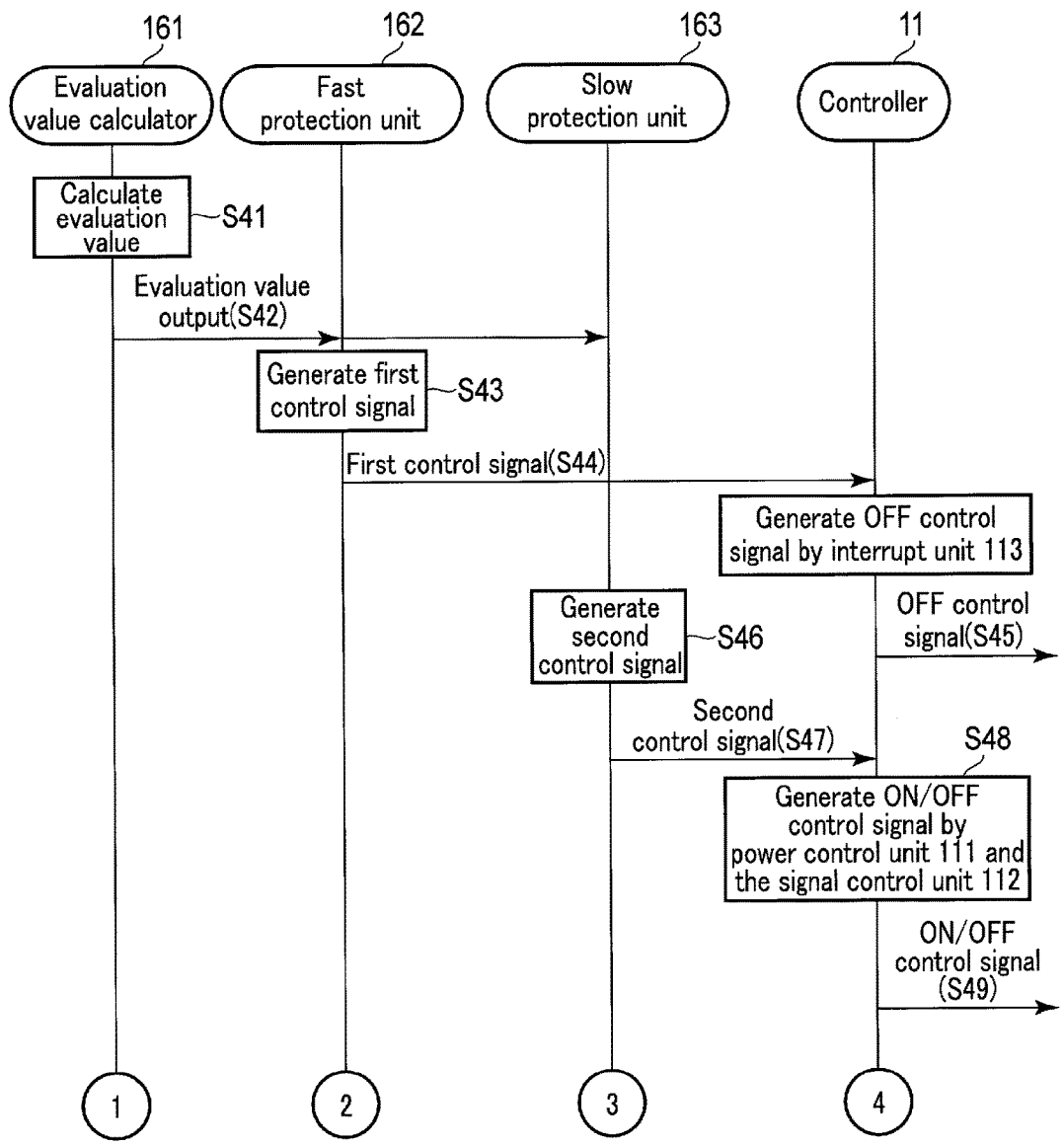
FIG. 4A is a sequence chart showing the first half of the processing procedure of the protection unit and the controller shown in FIG. 1.
Figure 4B:
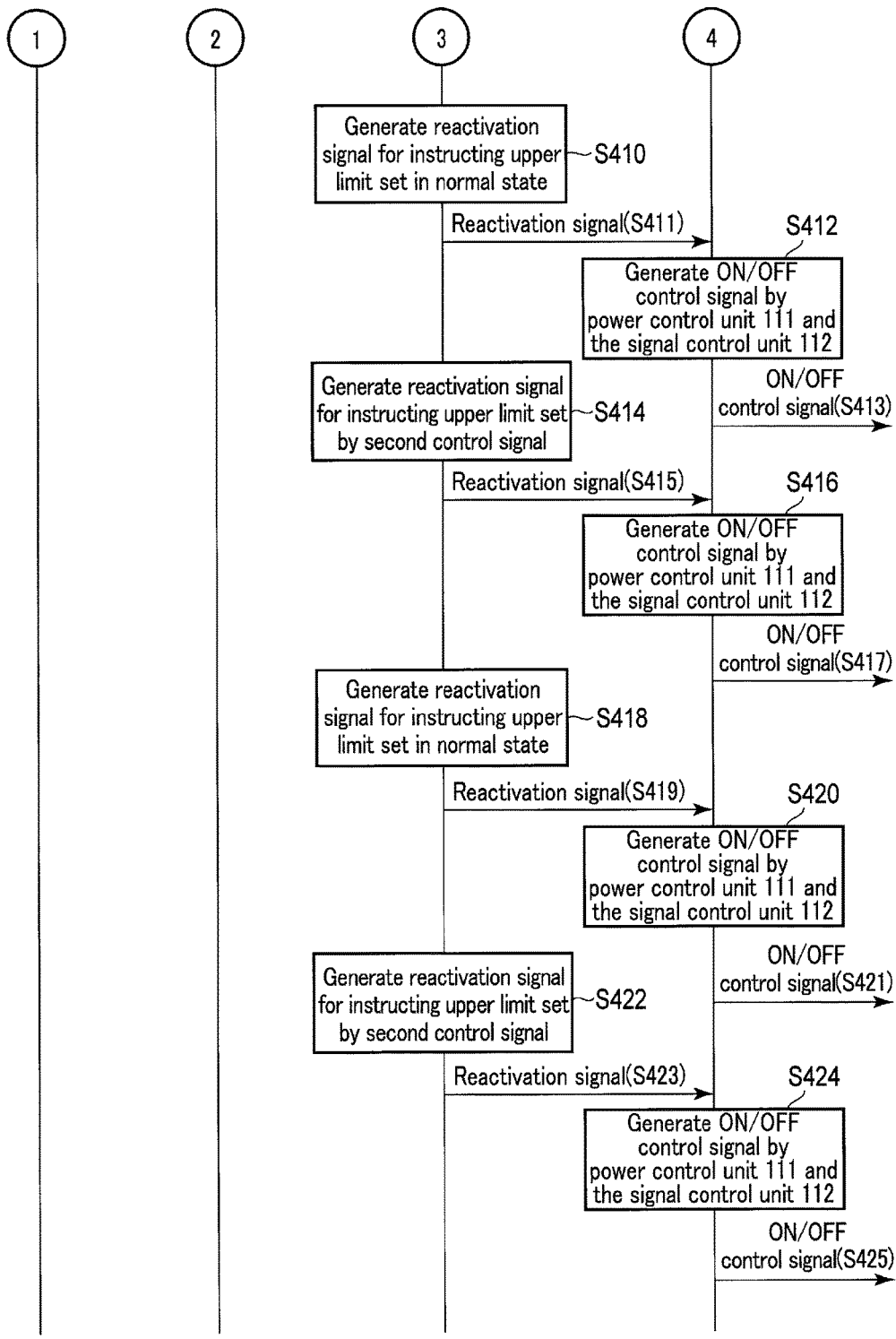
FIG. 4B is a sequence chart showing the second half of the processing procedure of the protection unit and the controller shown in FIG. 1.
Figure 5:
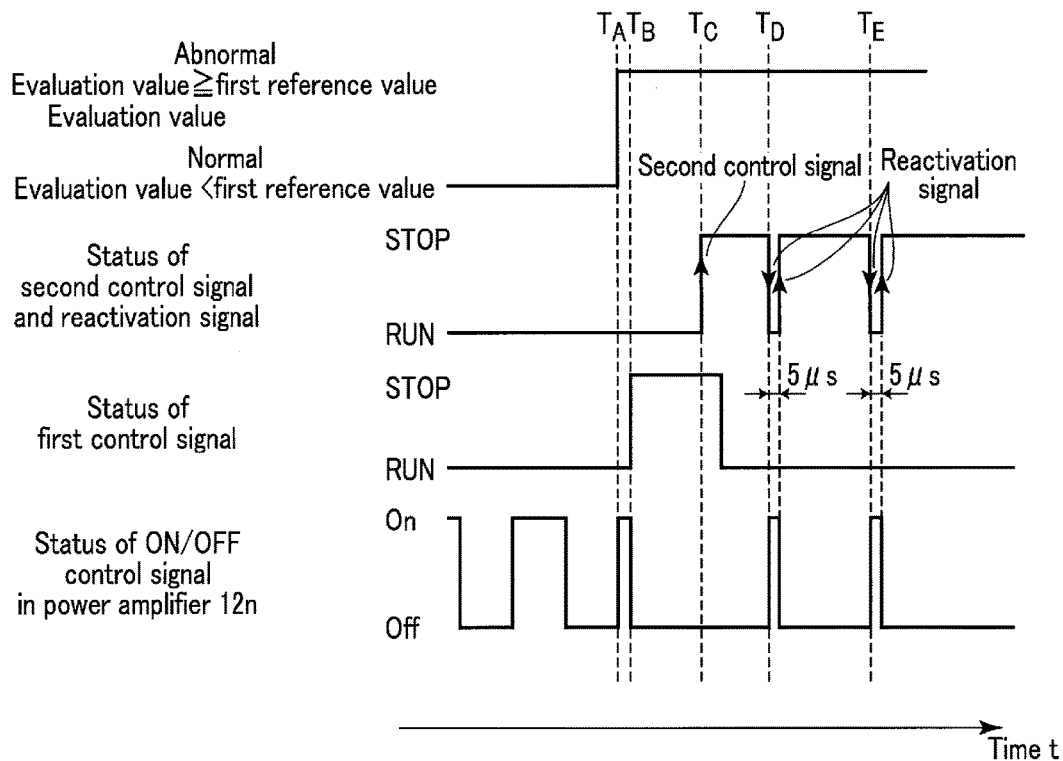
FIG. 5 is a timing chart showing a time transition when the digital amplitude modulation device shown in FIG. 1 controls power amplifiers.

The control operation of the power amplifiers 121 to 12n by the digital amplitude modulation device 100 having the above-described arrangement will be described next in accordance with the processing procedure of the protection unit 16 and the controller 11. Note that the control output unit 1631 of the slow protection unit 163 stores one of the second reference values as the first reference value, and the upper limit of the number of power amplifiers is set to 0 when the measurement value exceeds the first reference value. That is, in this embodiment, a state in which the evaluation value is smaller than the first reference value that is a preset threshold (evaluation value<first reference value=second reference value) is defined as a normal state, and a state in which the evaluation value is equal to or larger than the first reference value that is a preset threshold (evaluation value≥first reference value=second reference value) is defined as an abnormal state. FIG. 4 is a sequence chart showing the processing procedure of the protection unit 16 and the controller 11 when the digital amplitude modulation device 100 controls the power amplifiers 121 to 12n. FIG. 4A shows the first half of the sequence, and FIG. 4B shows the second half of the sequence. FIG. 5 is a timing chart showing the time transition of control of the power amplifier 12n. In FIG. 5, the ON/OFF control signal for the power amplifier 12n is assumed to repeat the ON state and the OFF state at a predetermined period until time $T_A$.

Referring to FIG. 4A, the evaluation value calculator 161 calculates the evaluation value based on the measurement value measured by the measurement unit 15 (sequence S41). The evaluation value calculator 161 outputs the calculated evaluation value to the fast protection unit 162 and the slow protection unit 163 (sequence S42).

Upon determining that some kind of abnormality has occurred at the time $T_A$ in FIG. 5, and the state has changed to the abnormal state in which the evaluation value is equal to or larger than the first reference value (evaluation value≥first reference value), at time $T_B$, the fast protection unit 162 generates the first control signal in the STOP status (sequence S43), and outputs the generated first control signal to the controller 11 (sequence S44). At this time, the time from occurrence of the abnormality to output of the first control signal, that is, the calculation processing amount of the control output unit 1621 is $T_B-T_A \approx 15$ μs, which is shorter than the minimum allowed time (100 μs) of the power amplifier 12n.

Upon receiving the first control signal, the controller 11 outputs an OFF control signal from the interrupt unit 113 to the power amplifier 12n (sequence S45).

Upon determining that the abnormality of some kind that has occurred at the time $T_A$ in FIG. 5 has caused the abnormal state in which the evaluation value is equal to or larger than the first reference value (evaluation value≥first reference value=second reference value), the slow protection unit 163 generates the second control signal in the STOP status at time $T_C$ after the elapse of the calculation delay time that occurs for calculation processing (sequence S46). The slow protection unit 163 outputs the generated second control signal to the controller 11 (sequence S47). At this time, the time from occurrence of the abnormality to output of the second control signal, that is, the calculation delay time in the control output unit 1631 is $T_C-T_A=0.5$ ms, which is longer than the minimum allowed time (100 μs) of the power amplifier 12n.

Upon receiving the second control signal, the controller 11 causes the power control unit 111 and the signal control unit 112 to generate an ON/OFF control signal based on the received second control signal (sequence S48), and causes the interrupt unit 113 to output the ON control signal/OFF control signal derived from the second control signal to the power amplifier 12n after the end of output of the ON/OFF control signal derived from the first control signal (sequence S49). In the control of the power amplifier 12n shown in FIG. 5, the controller 11 generates an OFF control signal in sequence S48, and causes the interrupt unit 113 to output the OFF control signal derived from the second control signal to the power amplifier 12n after the end of output of the OFF control signal derived from the first control signal in sequence S49.

Next, in FIG. 4B, at time $T_D$ when a predetermined time has elapsed after output of the second control signal, the slow protection unit 163 generates a reactivation signal that instructs the upper limit set before the evaluation value becomes equal to or larger than the reference value, that is, in the normal state (sequence S410). With the reactivation signal, the status of the second control signal changes from STOP to RUN. The slow protection unit 163 outputs the generated reactivation signal to the controller 11 at an interval of, for example, 5 μs and increments the count value of the reactivation count (sequence S411). Note that the pulse width (5 μs) of the reactivation signal is shorter than the minimum allowed time (100 μs) of the power amplifier 12n. Upon receiving the reactivation signal, the controller 11 causes the power control unit 111 and the signal control unit 112 to generate an ON/OFF control signal based on the received reactivation signal (sequence S412) and output the generated ON/OFF control signal to the power amplifier 12n (sequence S413).

When a time of 5 μs corresponding to the pulse width of the reactivation signal has elapsed, the slow protection unit 163 generates a reactivation signal that instructs the upper limit set by the second control signal (sequence S414). With the reactivation signal, the status of the second control signal changes from RUN to STOP. The slow protection unit 163 outputs the generated reactivation signal to the controller 11 (sequence S415). Upon receiving the reactivation signal, the controller 11 causes the power control unit 111 and the signal control unit 112 to generate an ON/OFF control signal based on the received reactivation signal (sequence S416) and output the generated ON/OFF control signal to the power amplifier 12n (sequence S417).

In the control of the power amplifier 12n shown in FIG. 5, at the time $T_D$, the controller 11 causes the power control unit 111 and the signal control unit 112 to generate an ON control signal based on the reactivation signal in sequence S412. In sequence S413, the controller 11 outputs the generated ON control signal to the power amplifier 12n. After the elapse of the predetermined pulse width, the controller 11 causes the power control unit 111 and the signal control unit 112 to generate an OFF control signal based on the reactivation signal in sequence S416. In sequence S417, the controller 11 outputs the generated OFF control signal to the power amplifier 12n.

After output of the reactivation signal, the slow protection unit 163 determines, by referring to the evaluation value, whether the abnormal state in which the evaluation value is equal to or larger than the first reference value (evaluation value≥first reference value=second reference value) is resolved. If recovery from the abnormal state does not occur, the slow protection unit 163 generates a reactivation signal again at time $T_E$ when a predetermined time has elapsed from the time $T_D$ (sequence S418). With the reactivation signal, the status of the second control signal changes from STOP to RUN. Note that the period $T_E-T_D$ is longer than the calculation delay time ($T_C-T_A=0.5$ ms) of the control output unit 1631. The slow protection unit 163 outputs the generated reactivation signal to the controller 11 and increments the count value of the reactivation count (sequence S419). Upon receiving the reactivation signal, the controller 11 causes the power control unit 111 and the signal control unit 112 to generate an ON/OFF control signal (sequence S420). The controller 11 outputs the generated ON/OFF control signal to the power amplifier 12n (sequence S421).

When a time of 5 µs corresponding to the pulse width of the reactivation signal has elapsed, the slow protection unit 163 generates a reactivation signal that instructs the upper limit set by the second control signal (sequence S422). With the reactivation signal, the status of the second control signal changes from RUN to STOP. The slow protection unit 163 outputs the generated reactivation signal to the controller 11 (sequence S423). Upon receiving the reactivation signal, the controller 11 causes the power control unit 111 and the signal control unit 112 to generate an ON/OFF control signal based on the received reactivation signal (sequence S424) and output the generated ON/OFF control signal to the power amplifier 12n (sequence S425).

In the control of the power amplifier 12n shown in FIG. 5, at the time $T_E$, the controller 11 generates an ON control signal in sequence S420, and outputs the generated ON control signal to the power amplifier 12n in sequence S421. After the elapse of the predetermined pulse width, the controller 11 causes the power control unit 111 and the signal control unit 112 to generate an OFF control signal based on the reactivation signal in sequence S424. In sequence S425, the controller 11 outputs the generated OFF control signal to the power amplifier 12n.

In the operation described with reference to FIGS. 4A, 4B, and 5, the number of times of reactivation processing is set to 2. If the abnormal state in which the evaluation value is equal to or larger than the first reference value (evaluation value≥first reference value=second reference value) is still unresolved even after the reactivation processing is executed twice, the slow protection unit 163 ends the reactivation processing and maintains the OFF state after the end. If the abnormal state is resolved during the reactivation processing executed twice, the slow protection unit 163 resets the fast protection unit 162 to return to the state before generation of the first control signal, and also executes processing before the abnormal state. Note that as for normal state/abnormal state determination, various cases can be assumed other than the example described in the embodiment. For example, assume that one of the second reference values is A, and the second reference value smaller than the second reference value A is B (second reference value A>second reference value B). If a state in which evaluation value<second reference value B changes to a state in which evaluation value≥second reference value A due to, for example, a lightning strike, the state in which evaluation value<second reference value B is determined as the normal state, and the state in which evaluation value≥second reference value A is determined as the abnormal state. On the other hand, if a state in which second reference value A>evaluation value-≥second reference value B is attained due to, for example, snowfall on the antenna, and the state changes to the state in which evaluation value≥second reference value A due to, for example, a lightning strike, the state in which second reference value A>evaluation value≥second reference value B is determined as the normal state, and the state in which evaluation value≥second reference value A is determined as the abnormal state.

As described above, according to the first embodiment, the evaluation value calculator 161 is formed using analog circuits, and calculates the evaluation value based on the measurement value. If the calculated evaluation value is equal to or larger than the first reference value that is a preset threshold, the fast protection unit 162 outputs the first control signal that instructs an OFF control signal for the power amplifiers 121 to 12n to the controller 11.

Figure 6:
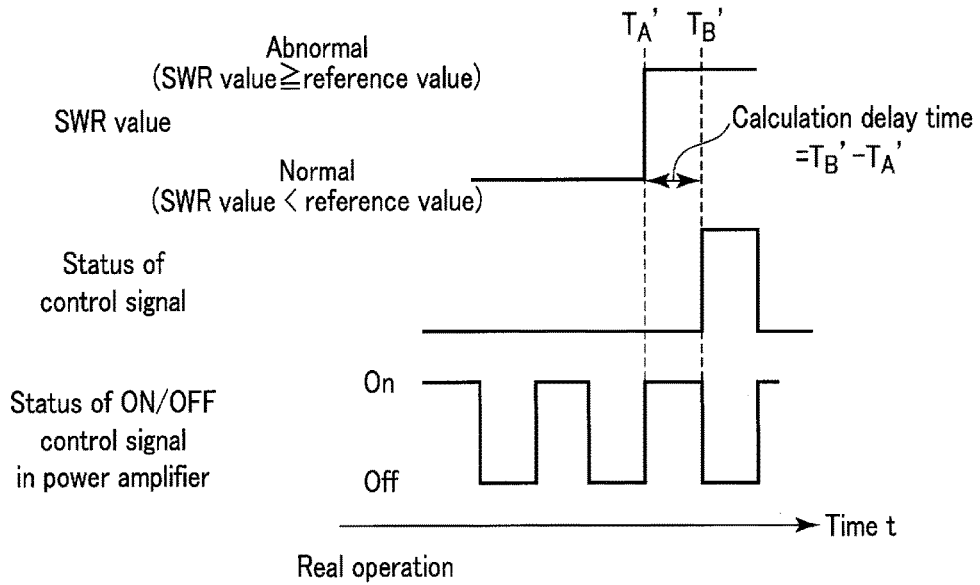
FIG. 6 is a timing chart showing the time transition of an ON/OFF control signal generated in a conventional digital amplitude modulation device.

In the conventional digital amplitude modulation device that calculates the SWR value using a digital circuit such as a CPU, a time lag exists from occurrence of an abnormality to control of an ON/OFF control signal because of the calculation delay time. FIG. 6 is a timing chart showing the time transition of an ON/OFF control signal generated in a digital amplitude modulation device of this type. The calculation delay amount is, for example, $T_B'-T_A'\approx 0.5$ ms, which is much longer than the minimum allowed time (100 µs) of the power amplifier. For this reason, the protection operation delays, and the power amplifier breaks. According to the digital amplitude modulation device 100 of this embodiment, the evaluation value calculator 161 formed using analog circuits calculates the evaluation value, and the fast protection unit 162 outputs, to the controller 11, the first control signal that instructs an OFF control signal for the power amplifiers 121 to 12n. This shortens the delay amount from occurrence of an abnormality to output of the first control signal. Since the protection unit 16 can thus shorten the calculation delay time as compared to the minimum allowed time (100 µs) of the power amplifiers, the power amplifier protection operation never delays, and breakage of power amplifiers can be prevented.

Hence, according to the digital amplitude modulation device of the first embodiment, it is possible to follow, in real time, even an abrupt change caused by occurrence of an abnormality.

Additionally, in the first embodiment, the slow protection unit 163 is formed using a digital circuit, and includes the control output unit 1631, the reactivation unit 1632, and the counter unit 1633. The control output unit 1631 outputs the second control signal to the controller 11. The reactivation unit 1632 executes reactivation processing using the counter unit 1633.

To cope with an abnormality that causes an abrupt change by the conventional digital amplitude modulation device, the protection unit can conceivably be formed using analog circuits. FIG. 7 is a block diagram showing the functional arrangement of a protection unit 20 formed using analog circuits in the conventional digital amplitude modulation device. The protection unit 20 shown in FIG. 7 includes an evaluation value calculator 22, a control output unit 23, a reactivation unit 24, a counter unit 25, a measurement value input terminal 21, and a control signal output terminal 26.

The evaluation value calculator 22 calculates an evaluation value that is one of an SWR value, reflection coefficient, and reflection power based on a measurement value including a voltage value and a current value measured by the measurement unit 15. The evaluation value calculator 22 outputs the calculated evaluation value to the control output unit 23. Based on the evaluation value calculated by the evaluation value calculator 22, the control output unit 23 calculates an OFF control signal or the upper limit of the number of power amplifiers to be ON-controlled. The control output unit 23 outputs the calculated OFF control signal or the upper limit of the number from the control signal output terminal 26 to the controller. The control output unit 23 also outputs the OFF control signal to the reactivation unit 24. The reactivation unit 24 outputs the OFF control signal or the upper limit of the number of power amplifiers to be ON-controlled to the controller via the control signal output terminal 26 as a reactivation signal in cooperation with the counter unit 25. The reactivation unit 24 attempts to continue the operation of the device by repeating the ON state again after the elapse of a predetermined time a designated number of times. The protection unit 20 is formed from analog circuits. Hence, to manage the time to output the reactivation signal and manage the count of the counter, the circuit scale becomes large. According to this embodiment, since the slow protection unit 163 is formed using a digital circuit, an increase in the circuit scale can be suppressed as compared to the case where the protection unit is formed using only analog circuits.

In the controller 11 according to the first embodiment, the interrupt unit 113 outputs, to the power amplifiers 121 to 12*n*, an OFF control signal according to the first control signal supplied from the fast protection unit 162 even when an ON/OFF control signal is supplied from the signal control unit 112. The controller 11 can thus quickly cope with the first control signal from the fast protection unit 162. That is, the controller 11 can execute the power amplifier protection operation in a period shorter than the minimum allowed time (100 μs) of the power amplifiers and prevent breakage of the power amplifiers.

In the first embodiment, the fast protection unit 162 sets the pulse width of the first control signal longer than the calculation delay time in the slow protection unit 163. This makes it possible to prevent a time from occurring between the first control signal and the second control signal and prevent breakage of the power amplifiers.

The digital amplitude modulation device 100 according to the first embodiment includes the measurement unit 15 at the subsequent stage of the filter 14. This allows the measurement unit 15 to measure an abnormality that occurs between the measurement unit 15 and the antenna.

Figure 8:
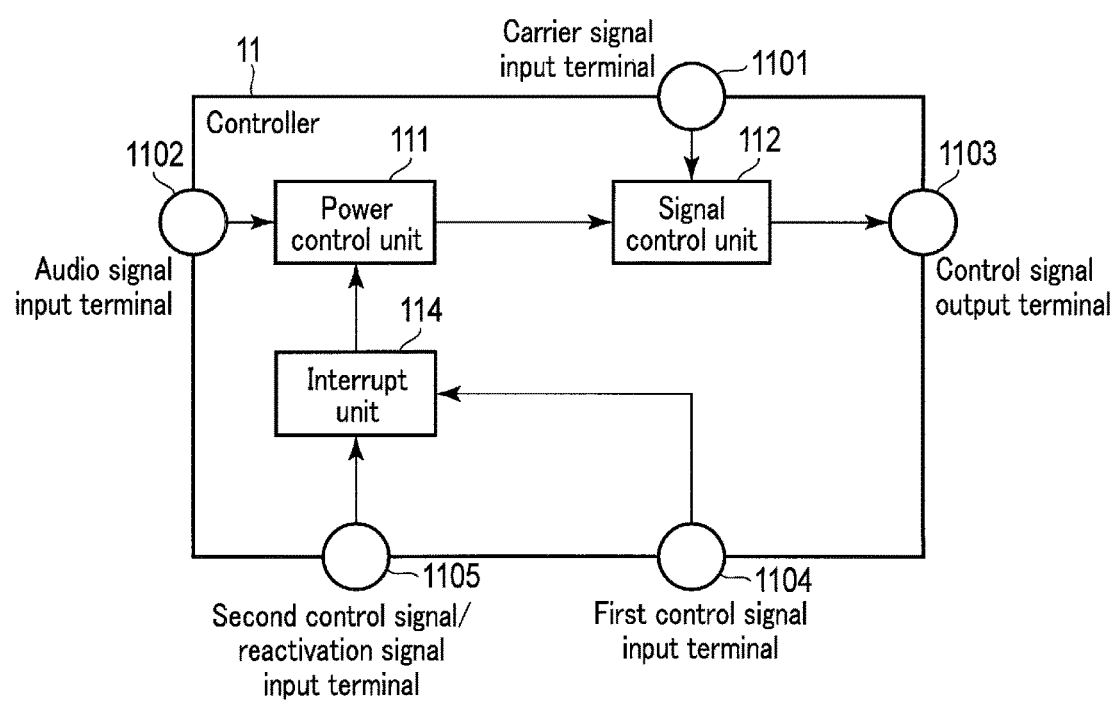
FIG. 8 is a block diagram showing another example of the functional arrangement of the controller shown in FIG. 1.

Note that in the first embodiment, an example in which the controller 11 has the arrangement shown in FIG. 3 has been described. However, the present invention is not limited to this. For example, the controller 11 may have an arrangement shown in FIG. 8. That is, the controller 11 includes the power control unit 111, the signal control unit 112, an interrupt unit 114, the carrier signal input terminal 1101, the audio signal input terminal 1102, the first control signal input terminal 1104, and the second control signal/reactivation signal input terminal 1105.

The interrupt unit 114 receives the second control signal input to the second control signal/reactivation signal input terminal 1105. The interrupt unit 114 notifies the power control unit 111 of the upper limit instructed by the received second control signal.

The interrupt unit 114 also receives the first control signal input to the first control signal input terminal 1104 and the second control signal input to the second control signal/reactivation signal input terminal 1105. Upon receiving the first control signal, the interrupt unit 114 sets the upper limit of the number of power amplifiers to be ON-controlled to 0. The interrupt unit 114 gives priority to the upper limit acquired based on the first control signal over the upper limit instructed by the second control signal, and notifies the power control unit 111 of the upper limit acquired based on the first control signal.

When notified of the upper limit instructed by the second control signal by the interrupt unit 114, the power control unit 111 calculates, in accordance with the voltage amplitude level of the audio signal, which power amplifiers should be ON-controlled out of the power amplifiers 121 to 12*n* within the notified upper limit. The power control unit 111 outputs information representing which power amplifiers should be ON/OFF-controlled out of the power amplifiers 121 to 12*n* to the signal control unit 112.

Upon receiving a notification representing the upper limit of 0 derived from the first control signal in place of the upper limit instructed by the second control signal, the power control unit 111 outputs information representing that the power amplifiers 121 to 12*n* should be OFF-controlled to the signal control unit 112.

The controller 11 can thus quickly cope with the first control signal from the fast protection unit 162. That is, the controller 11 can execute the power amplifier protection operation in a period shorter than the minimum allowed time (100 μs) of the power amplifiers and prevent breakage of the power amplifiers.

In the first embodiment, an example in which the reactivation unit 1632 generates a reactivation signal having a predetermined pulse width, as shown in FIG. 5, has been described. However, the present invention is not limited to this. For example, the reactivation unit 1632 may output, as a reactivation signal, a signal that instructs the same upper limit as the upper limit set before occurrence of an abnormality and also reset the control output unit 1621 of the fast protection unit 162.

Figure 9:
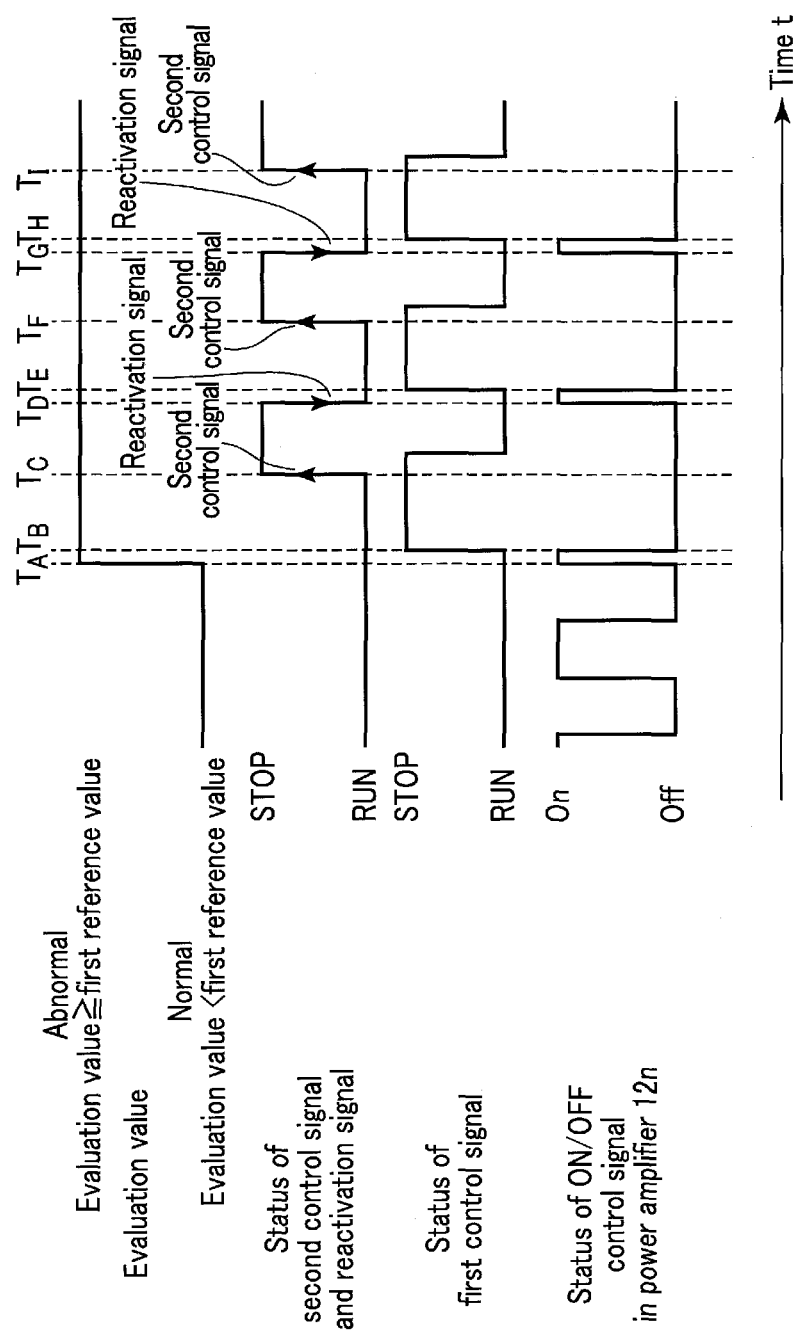
FIG. 9 is a timing chart showing another example of the time transition shown in FIG. 5.

FIG. 9 is a timing chart showing the time transition of control of the power amplifier 12*n* in a case where the evaluation value exceeds the first reference value that is preset threshold, and it is determined that an abnormality has occurred. Note that in FIG. 9, the second control signal instructs that the upper limit of the number of power amplifiers 121 to 12*n* to be ON-controlled is 0.

Upon determining that some kind of abnormality has occurred at the time $T_A$ in FIG. 9, and the state has changed to the abnormal state in which the evaluation value is equal to or larger than the first reference value (evaluation value-≥first reference value), at the time $T_B$, the fast protection unit 162 generates the first control signal in the STOP status. Upon receiving the first control signal, the controller 11 outputs an OFF control signal to the power amplifier 12*n*.

Upon determining that the abnormality of some kind that has occurred at the time $T_A$ in FIG. 9 has caused the abnormal state in which the evaluation value is equal to or larger than the first reference value, the slow protection unit 163 generates the second control signal in the STOP status at the time $T_C$ after the elapse of the calculation delay time that occurs for calculation processing. Upon receiving the second control signal, the controller 11 causes the power control unit 111 and the signal control unit 112 to generate an OFF control signal.

At the time $T_D$ when a predetermined time has elapsed after output of the second control signal, the slow protection unit 163 generates a reactivation signal that instructs the upper limit set before the evaluation value becomes equal to or larger than the first reference value, that is, in the normal state. With the reactivation signal, the status of the second control signal changes from STOP to RUN. The slow protection unit 163 outputs the generated reactivation signal to the controller 11, increments the count value of the reactivation count, the outputs a reset signal to the fast protection unit 162. Upon receiving the reactivation signal, the controller 11 causes the power control unit 111 and the signal control unit 112 to generate an ON control signal and output the generated ON control signal to the power amplifier 12*n*. Upon receiving the reset signal, the fast protection unit 162 returns to the state before generation of the first control signal.

Upon determining, by referring to the evaluation value derived from the reactivation signal generated at the time $T_D$ in FIG. 9, that the abnormal state continues, the fast protection unit 162 generates the first control signal in the STOP status at the time $T_E$. Upon receiving the first control signal, the controller 11 outputs an OFF control signal to the power amplifier 12n.

After output of the reactivation signal, the slow protection unit 163 determines, by referring to the evaluation value, whether the abnormal state is resolved. If recovery from the abnormal state does not occur, the slow protection unit 163 generates the second control signal in the RUN status at time $T_F$ after the elapse of the calculation delay time. At time $T_G$ when a predetermined time has elapsed after output of the second control signal, the slow protection unit 163 generates a reactivation signal again. The slow protection unit 163 outputs the generated reactivation signal to the controller 11, increments the count value of the reactivation count, and outputs a reset signal to the fast protection unit 162. Upon receiving the reactivation signal, the controller 11 causes the power control unit 111 and the signal control unit 112 to generate an ON control signal and output the generated ON control signal to the power amplifier 12n. Upon receiving the reset signal, the fast protection unit 162 returns to the state before generation of the first control signal.

Upon determining, by referring to the evaluation value derived from the reactivation signal generated at the time $T_G$ in FIG. 9, that the abnormal state continues, the fast protection unit 162 generates the first control signal at time $T_H$. Upon receiving the first control signal, the controller 11 outputs an OFF control signal to the power amplifier 12n.

After output of the reactivation signal, the slow protection unit 163 determines, by referring to the evaluation value, whether the abnormal state is resolved. If recovery from the abnormal state does not occur, the slow protection unit 163 generates the second control signal at time $T_I$ after the elapse of the calculation delay time.

In the operation described with reference to FIG. 9, the number of times of reactivation processing is set to 2. If the abnormal state in which the evaluation value is equal to or larger than the first reference value (evaluation value≥first reference value) is still unresolved even after the reactivation processing is executed twice, the slow protection unit 163 ends the reactivation processing and maintains the OFF state after the end.

Second Embodiment

FIG. 10 is a block diagram showing the functional arrangement of a digital amplitude modulation device 200 according to the second embodiment. The digital amplitude modulation device 200 shown in FIG. 10 includes a controller 11, a power amplification unit 12, a compositor 13, a measurement unit 17, a filter 14, a protection unit 16, a carrier signal input terminal 101, and an audio signal input terminal 102.

In the digital amplitude modulation device 200 according to the second embodiment, the measurement unit 17 is located at the subsequent stage of the compositor 13 and at the preceding stage of the filter 14, and measures the voltage value and the current value of a composite signal supplied from the compositor 13. This allows the measurement unit 17 to measure an abnormality that occurs between the compositor 13 and the measurement unit 17.

In the second embodiment, an evaluation value calculator 161 is formed using analog circuits including analog ICs, for example, an operational amplifier and a comparator, and calculates an evaluation value based on a measurement value measured by the measurement unit 17. If the calculated evaluation value is equal to or larger than a first reference value that is a preset threshold, a fast protection unit 162 outputs, to the controller 11, a first control signal that instructs an OFF control signal for power amplifiers 121 to 12n. Hence, even if the compositor 13 short-circuits and/or open-circuits, the digital amplitude modulation device 200 never delays the power amplifier protection operation and can prevent breakage of the power amplifiers.

In the second embodiment, a slow protection unit 163 is formed using a digital circuit. The slow protection unit 163 refers to the evaluation value calculated by the evaluation value calculator 161, and outputs a second control signal to the controller 11. The slow protection unit 163 executes reactivation processing when a predetermined time has elapsed after stop of the power amplifiers 121 to 12n. This allows the digital amplitude modulation device 200 to suppress an increase in the circuit scale as compared to a case where the protection unit is formed using only analog circuits.

Hence, according to the digital amplitude modulation device 200 of the second embodiment, it is possible to follow, in real time, even an abrupt change caused by occurrence of an abnormality and also suppress an increase in the circuit scale.

While certain embodiments of the inventions have been described, these embodiments have been presented by way of examples only, and are not intended to limit the scope of the inventions. Indeed, the embodiments may be implemented in a variety of other forms, and various omissions, substitutions and changes may be made without departing from the spirit of the inventions. The appended claims and their equivalents are intended to cover such forms or modifications as would fall within the scope and spirit of the inventions.

REFERENCE SIGNS LIST

100 . . . digital amplitude modulation device, 11 . . . controller, 111 . . . power control unit, 112 . . . signal control unit, 113, 114 . . . interrupt unit, 1101 . . . carrier signal input terminal, 1102 . . . audio signal input terminal, 1103 . . . control signal output terminal, 1104 . . . first control signal input terminal, 1105 . . . second control signal/reactivation signal input terminal, 12 . . . power amplification unit, 121-12n . . . power amplifier, 13 . . . compositor, 14 . . . filter, 15, 17 . . . measurement unit, 16 . . . protection unit, 161 . . . evaluation value calculator, 1611 . . . measurement value input terminal, 162 . . . fast protection unit, 1621 . . . control output unit, 1622 . . . first control signal output terminal, 163 . . . slow protection unit, 1631 . . . control output unit, 1632 . . . reactivation unit, 1633 . . . counter unit, 1634 . . . second control signal/reactivation signal output terminal, 101 . . . carrier signal input terminal, 102 . . . audio signal input terminal, 103 . . . signal output terminal, 20 . . . protection unit, 21 . . . measurement value input terminal, 22 . . . evaluation value calculation unit, 23 . . . control output unit, 24 . . . reactivation unit, 25 . . . counter unit, 26 . . . control signal output terminal

The invention claimed is:

1. A digital amplitude modulation device comprising:
a plurality of power amplifiers arranged in parallel and configured to amplify an input signal in accordance with ON control and stop output in accordance with OFF control;
a compositor configured to composite signals output from the plurality of power amplifiers to generate a composite signal;

a filter configured to suppress an unnecessary component of the composite signal generated by the compositor to generate an AM (Amplitude Modulation) signal in an RF (Radio Frequency) band;

a measurement unit configured to measure a measurement value between the filter and a signal output terminal configured to output the AM signal in the RF band generated by the filter;

a protection unit including a calculator formed from an analog circuit and configured to calculate an evaluation value based on the measurement value measured by the measurement unit, and a first processing unit formed from an analog circuit and configured to generate a first control signal for OFF-controlling the plurality of power amplifiers based on the calculated evaluation value; and a controller configured to ON-control and/or OFF-control the plurality of power amplifiers by referring to an amplitude level of a modulated signal, and upon receiving the first control signal, OFF-control the plurality of power amplifiers.

2. The digital amplitude modulation device according to claim 1, wherein the protection unit further comprises a second processing unit formed from a digital circuit and configured to generate a reactivation signal for reactivating the plurality of OFF-controlled power amplifiers, and the controller ON-controls the plurality of OFF-controlled power amplifiers based on the reactivation signal.

3. The digital amplitude modulation device according to claim 2, wherein the second processing unit generates a second control signal for instructing an upper limit of the number of power amplifiers when ON-controlling any of the plurality of power amplifiers based on one of the calculated evaluation value and an evaluation value calculated based on the measurement value measured by the measurement unit, and the controller ON-controls the plurality of power amplifiers within the upper limit instructed by the second control signal.

4. The digital amplitude modulation device according to claim 3, wherein the controller comprises:

a power control unit configured to decide the plurality of power amplifiers to be ON-controlled within the upper limit instructed by the second control signal by referring to the amplitude level of the modulated signal;

a signal control unit configured to generate an ON control signal and/or an OFF control signal based on a decision result of the plurality of power amplifiers to be ON-controlled in accordance with a frequency of a carrier signal; and an interrupt unit configured to output the ON control signal and/or the OFF control signal to the plurality of power amplifiers, and upon receiving the first control signal, output an OFF control signal generated in accordance with the first control signal to the plurality of power amplifiers with priority over the ON control signal and/or the OFF control signal.

5. The digital amplitude modulation device according to claim 3, wherein the controller comprises:

an interrupt unit configured to output the upper limit instructed by the second control signal, and upon receiving the first control signal, set the upper limit to 0 and output the upper limit of 0 to the plurality of power amplifiers with priority over the upper limit instructed by the second control signal;

a power control unit configured to, upon receiving the upper limit instructed by the second control signal, decide the number of power amplifiers to be ON-controlled within the upper limit instructed by the second control signal by referring to the amplitude level of the modulated signal, and upon receiving the upper limit of 0, set the number of power amplifiers to be ON-controlled to 0; and a signal control unit configured to generate an ON control signal and/or an OFF control signal based on a decision result of the power amplifiers to be ON-controlled in accordance with a frequency of a carrier signal.

6. The digital amplitude modulation device according to claim 3, wherein a width of the first control signal is longer than a calculation delay time in the second processing unit.

7. A digital amplitude modulation device comprising:

a plurality of power amplifiers arranged in parallel and configured to amplify an input signal in accordance with ON control and stop output in accordance with OFF control;

a compositor configured to composite signals output from the plurality of power amplifiers to generate a composite signal;

a measurement unit configured to measure a measurement value of the composite signal generated by the compositor;

a filter configured to suppress an unnecessary component of the composite signal generated by the compositor to generate an AM (Amplitude Modulation) signal in an RF (Radio Frequency) band;

a protection unit including a calculator formed from an analog circuit and configured to calculate an evaluation value based on the measurement value measured by the measurement unit, and a first processing unit formed from an analog circuit and configured to generate a first control signal for OFF-controlling the plurality of power amplifiers based on the calculated evaluation value; and a controller configured to ON-control and/or OFF-control the plurality of power amplifiers by referring to an amplitude level of a modulated signal, and upon receiving the first control signal, OFF-control the plurality of power amplifiers.

8. The digital amplitude modulation device according to claim 7, wherein the protection unit further comprises a second processing unit formed from a digital circuit and configured to generate a reactivation signal for reactivating the plurality of OFF-controlled power amplifiers, and the controller ON-controls the plurality of OFF-controlled power amplifiers based on the reactivation signal.

9. A digital amplitude modulation method used by a digital amplitude modulation device including a plurality of power amplifiers arranged in parallel and configured to amplify an input signal in accordance with ON control and stop output in accordance with OFF control, the method comprising:

calculating an evaluation value using an analog circuit based on a measurement value measured between a filter and a signal output terminal configured to output an AM (Amplitude Modulation) signal in an RF (Radio Frequency) band generated by the filter;

generating, using an analog circuit, a first control signal for OFF-controlling the plurality of power amplifiers based on the calculated evaluation value;

OFF-controlling the plurality of power amplifiers based on the first control signal;

generating, using a digital circuit, a reactivation signal for reactivating the plurality of OFF-controlled power amplifiers; and ON-controlling the plurality of OFF-controlled power amplifiers based on the reactivation signal.

10. A digital amplitude modulation method used by a digital amplitude modulation device including a plurality of power amplifiers arranged in parallel and configured to amplify an input signal in accordance with ON control and stop output in accordance with OFF control, the method comprising:

calculating an evaluation value using an analog circuit based on a measurement value obtained by measuring a composite signal generated by a compositor;

generating, using an analog circuit, a first control signal for OFF-controlling the plurality of power amplifiers based on the calculated evaluation value;

OFF-controlling the plurality of power amplifiers based on the first control signal;

generating, using a digital circuit, a reactivation signal for reactivating the plurality of OFF-controlled power amplifiers; and ON-controlling the plurality of OFF-controlled power amplifiers based on the reactivation signal.

\* \* \* \* \*